(12) United States Patent
Tsai et al.

(10) Patent No.: US 12,248,130 B2
(45) Date of Patent: Mar. 11, 2025

(54) ULTRAVIOLET LIGHT ARRAY MODULE

(71) Applicant: Cristal Materials Corporation, Taipei (TW)

(72) Inventors: Jung-Lin Tsai, Taipei (TW); Ershien Tsai, Taipei (TW)

(73) Assignee: CRISTAL MATERIALS CORPORATION, Taipei (TW)

( * ) Notice: Subject to any disclaimer, the term of this patent is extended or adjusted under 35 U.S.C. 154(b) by 561 days.

(21) Appl. No.: 17/730,646

(22) Filed: Apr. 27, 2022

(65) Prior Publication Data

US 2022/0350122 A1 Nov. 3, 2022

(30) Foreign Application Priority Data

Apr. 29, 2021 (TW) ................................. 110115625

(51) Int. Cl.
| | |
|---|---|
| *G02B 19/00* | (2006.01) |
| *H01L 25/07* | (2006.01) |
| *H01L 25/075* | (2006.01) |
| *H01L 33/48* | (2010.01) |
| *H01L 33/58* | (2010.01) |

(52) U.S. Cl.
CPC ..... *G02B 19/0009* (2013.01); *G02B 19/0066* (2013.01); *H01L 25/0753* (2013.01); *H01L 33/58* (2013.01); *H01L 33/483* (2013.01)

(58) Field of Classification Search
CPC ............ G02B 19/0009; G02B 19/0066; H01L 25/0753; H01L 33/58; H01L 33/483
See application file for complete search history.

(56) References Cited

U.S. PATENT DOCUMENTS

| | | | |
|---|---|---|---|
| 10,418,501 B2* | 9/2019 | Fisher | ................. H01L 31/0475 |
| 2011/0226332 A1* | 9/2011 | Ford | .................... G02B 6/0038 |
| | | | 257/E31.127 |
| 2015/0076468 A1* | 3/2015 | Yamaguchi | .............. G02B 5/18 |
| | | | 156/247 |
| 2017/0250327 A1* | 8/2017 | Hsieh | ..................... H01L 33/60 |

FOREIGN PATENT DOCUMENTS

| | | |
|---|---|---|
| JP | 2017108105 A | 6/2017 |
| JP | 2021022640 A | 2/2021 |

* cited by examiner

*Primary Examiner* — Nicole M Ippolito
(74) *Attorney, Agent, or Firm* — MUNCY, GEISSLER, OLDS & LOWE, P.C.

(57) ABSTRACT

An ultraviolet light array module has a substrate, multiple ultraviolet light chips, and an amorphous silicon concentrator. The substrate has a concave. The ultraviolet light chips are arranged in an array in the concave of the substrate. The amorphous silicon concentrator covers on the concave and includes a light-transmitting base and multiple continuous light-concentrating protrusions. The optical axis of each light-concentrating protrusion aligns with the light-emitting axis of the corresponding ultraviolet light chip to generate ultraviolet light with a specific light-emitting angle. Since the light-concentrating protrusions are integrally formed on the light-transmitting base, the optical axes of the light-concentrating protrusions are close to each other and align with the light-emitting axes of the ultraviolet light chips underneath. By superimposing these ultraviolet lights that maintain the same light-emitting angle, under the same irradiation distance, the central illuminance is greatly increased, and the uniform light shape is maintained.

20 Claims, 11 Drawing Sheets

ULTRAVIOLET LIGHT ARRAY MODULE

CROSS-REFERENCE TO RELATED APPLICATIONS

This application is based upon and claims priority under 35 U.S.C. 119 from Taiwan Patent Application No. 110115625 filed on Apr. 29, 2021, which is hereby specifically incorporated herein by this reference thereto.

BACKGROUND OF THE INVENTION

1. Field of the Invention

The present invention relates to an ultraviolet light element, especially an ultraviolet light array module.

2. Description of the Prior Arts

Ultraviolet light is roughly divided into three different bands of ultraviolet light by wavelength: UVA, UVB, and UVC. Among them, UVC is more common in curing, medical or sterilization applications.

With reference to FIG. 9A, a conventional planar ultraviolet light array module 50 includes a base 51, a plurality of UVC chips 52, and a planar light-transmitting plate 53. The UVC chips 52 are disposed on the base 51 and covered with the planar light-transmitting plate 53. Since the wavelengths of the UVC chips 52 are in the UVC band, the planar light-transmitting plate 53 must use a quartz plate instead of a lower-cost glass plate. However, since the planar light-transmitting plate 53 of the planar ultraviolet light array module 50 has no light-converging property, the light-emitting angle is large and the light shape is uneven. As shown in FIG. 9B, in the case of sterilization applications, the sterilization ability in a certain sterilization range is limited.

With reference to FIG. 10A, another conventional ultraviolet light array module 60 includes a base 61, a plurality of UVC chips 63, and a single-quartz lens 62. The UVC chips 63 are disposed on the base 61 and covered with the single-quartz lens 62. Since the single-quartz lens 62 only has a single optical axis 621, the corresponding light-emitting axis 631 of the UVC chips 63 located below the single-quartz lens 62 cannot be aligned with the optical axis 621 of the single-quartz lens 62 and is arranged off-axis as shown in FIG. 10B. With further reference to FIG. 11, although the light-emitting angle of the ultraviolet light array module 60 is smaller than that of the ultraviolet light array module 50 as shown in FIG. 9A, the light shape is still uneven. With further reference to FIG. 12, after the ultraviolet light array module 60 is irradiated to a certain distance, the bright areas 71 and the dark areas 70 are clearly distinguished. The dark areas 70 are among the bright areas 71, which means that the central illuminance of the ultraviolet light array module 60 is low, so the actual sterilization effect in a certain sterilization range is still limited.

Therefore, if the ultraviolet light array module can be improved and its luminous efficiency can be increased, the application breadth of the ultraviolet light array module can be greatly increased.

SUMMARY OF THE INVENTION

To overcome the shortcomings of the conventional ultraviolet light array modules, the present invention provides an ultraviolet light array module with high luminous efficiency.

The ultraviolet light array module has a substrate, multiple ultraviolet light chips, and an amorphous silicon concentrator. The substrate has a concave. The ultraviolet light chips are arranged in an array in the concave of the substrate. The amorphous silicon concentrator covers on the concave and includes a light-transmitting base and multiple continuous light-concentrating protrusions. The optical axis of each light-concentrating protrusion aligns with the light-emitting axis of the corresponding ultraviolet light chip to generate ultraviolet light with a specific light-emitting angle. Since the light-concentrating protrusions are integrally formed on the light-transmitting base, the optical axes of the light-concentrating protrusions are close to each other and align with the light-emitting axes of the ultraviolet light chips underneath. By superimposing these ultraviolet lights that maintain the same light-emitting angle, under the same irradiation distance, the central illuminance is greatly increased, and the uniform light shape is maintained.

DETAILED DESCRIPTION OF THE EMBODIMENTS

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, or the actual ratio. Some of the dimensions or dimension ratios have been enlarged or simplified to provide a better illustration. The actual numbers, actual shapes, or actual dimension ratios can be selectively designed and disposed and the detailed component layouts may be more complicated.

Figure 1:
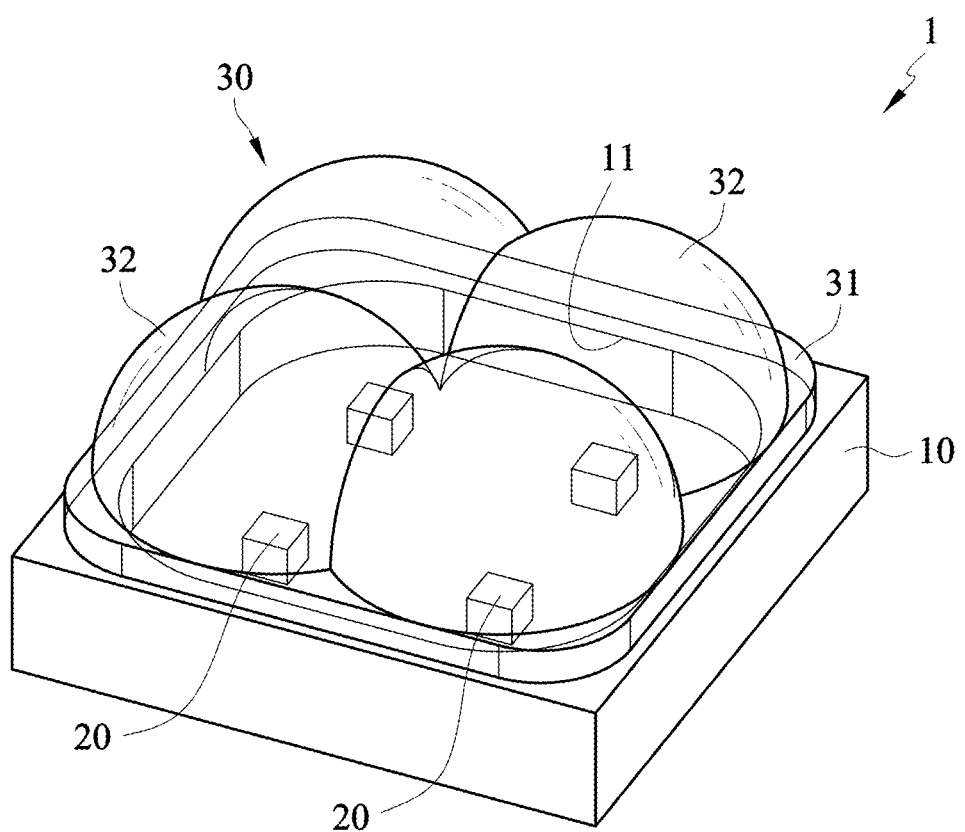
FIG. 1 is a perspective view of a first embodiment of an ultraviolet light array module in accordance with the present invention.
Figure 2:
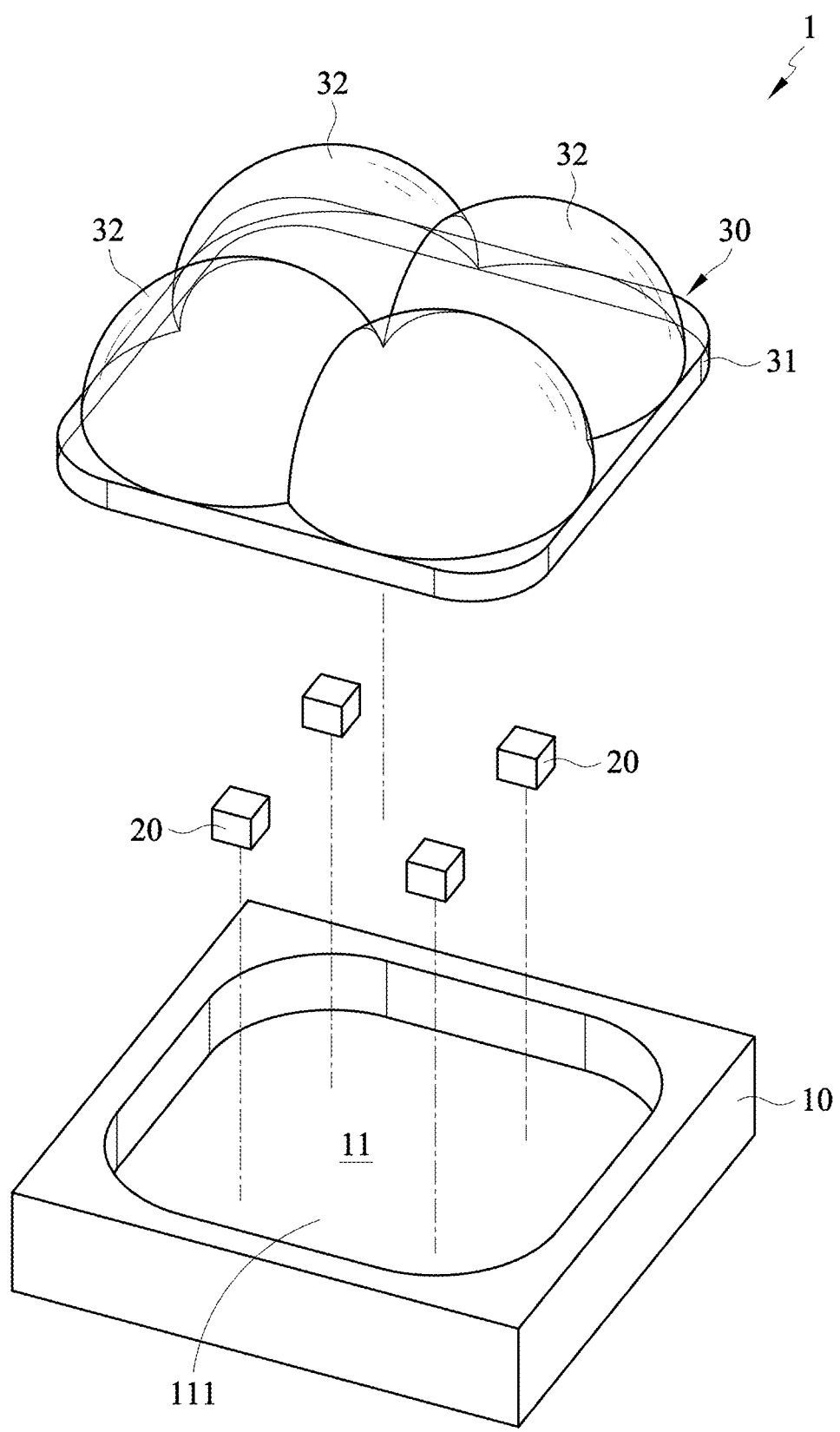
FIG. 2 is an exploded perspective view of the ultraviolet light array module in FIG. 1.

With reference to FIG. 1, an ultraviolet light array module 1 in accordance with the present invention comprises a substrate 10, multiple ultraviolet light (UV) chips 20, and an amorphous silicon concentrator 30. With reference to FIG. 2, the substrate 10 has a concave 11 formed on a top surface of the substrate 10. In one embodiment, the concave 11 is rectangular and has a bottom surface 111.

Figure 3:
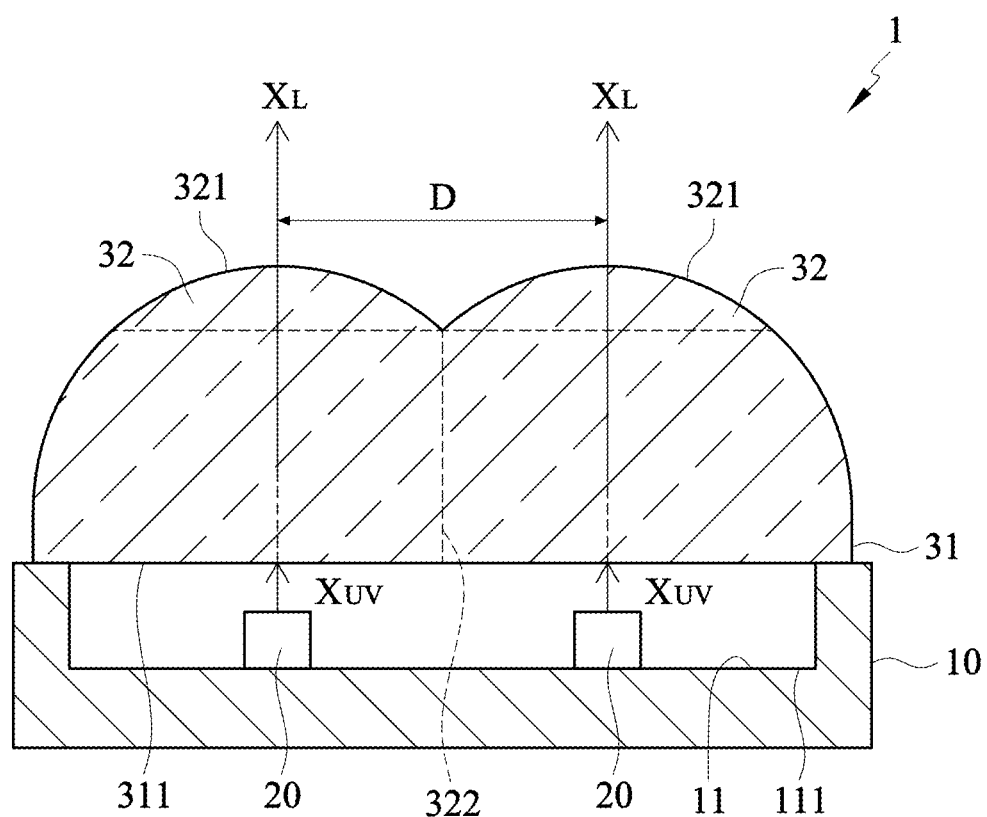
FIG. 3 is a side view in partial section of the ultraviolet light array module in FIG. 1.

The UV chips 20 are disposed in the concave 11 of the substrate 10 and are arranged in an n*m matrix. The "n" may be equal to, larger than, or smaller than the "m". Each UV chip 20 has a light-emitting axis $X_{UV}$ as shown in FIG. 3. In one embodiment, n=m=2. Thus, the four UV chips 20 are arranged in a 2*2 matrix on the bottom surface 111 of the concave 11. The height of the UV chips 20 is lower than the depth of the concave 11, so the UV chips 20 do not protrude from the concave 11. In one embodiment, the UV chips 20 are UVC chips with the emission wavelength range between UVC band (200 nm-280 nm). The emission wavelength may be 254 nm±5 nm, 260 nm±5 nm to 265 nm±5 nm, or 270 nm±5 nm.

Figure 4:
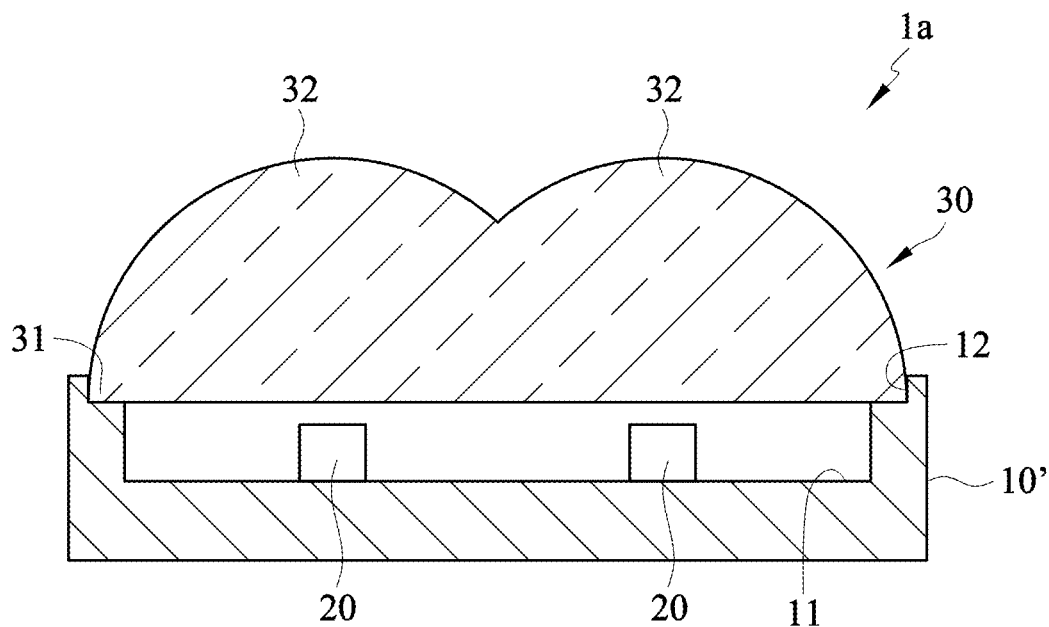
FIG. 4 is a side view in partial section of a second embodiment of an ultraviolet light array module in accordance with the present invention.

The amorphous silicon concentrator 30 is disposed on the substrate 10 to cover the concave 11 and comprises a light-transmitting base 31 and multiple light-concentrating protrusions 32. The light-concentrating protrusions 32 are formed on the light-transmitting base 31 continuously and are arranged in the n*m matrix to correspond to the UV chips arranged in the n*m matrix. In one embodiment, the light-concentrating protrusions 32 are arranged in a 2*2 matrix. A bottom surface 311 of the light-transmitting base 31 is larger than the opening size of the concave 11, so the light-transmitting base 31 is directly disposed on the top surface of the base 10 to cover the concave 11. Thus, the light-emitting base 31 keeps a distance from the UV chips 20. Another embodiment of an ultraviolet light array module 1 in accordance with the present invention is shown in FIG. 4. The substrate 10' has a stepped portion 12 formed on a periphery of the top surface of the substrate 10'. Therefore, the light-transmitting base 31 is embedded in the stepped portion 12 of the substrate 10' to cover the concave 11.

Figure 5:
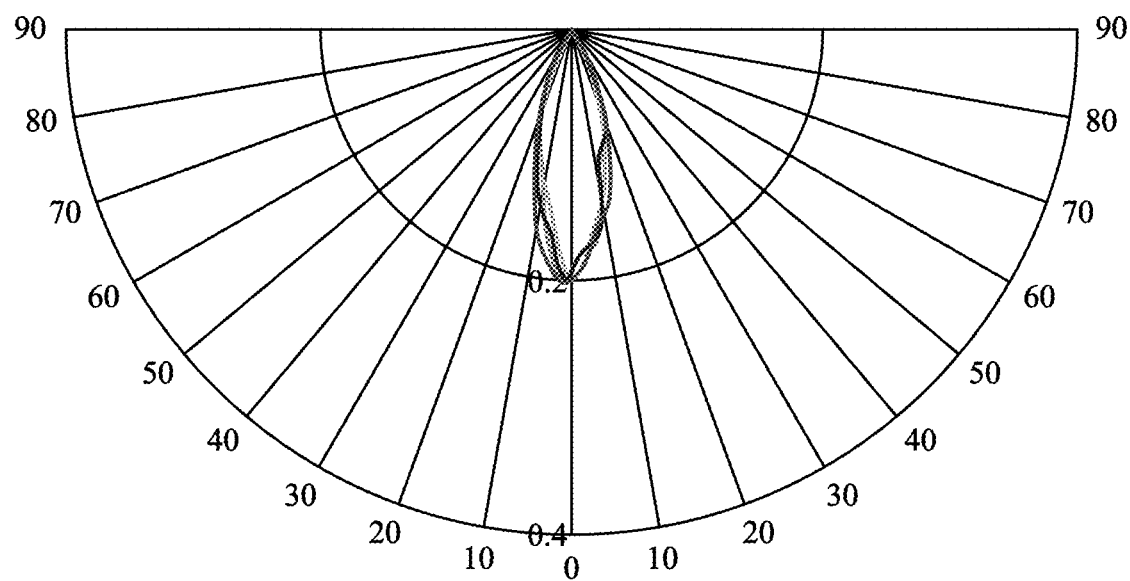
FIG. 5 is a light shape diagram of the ultraviolet light array module in FIG. 1.
Figure 6:
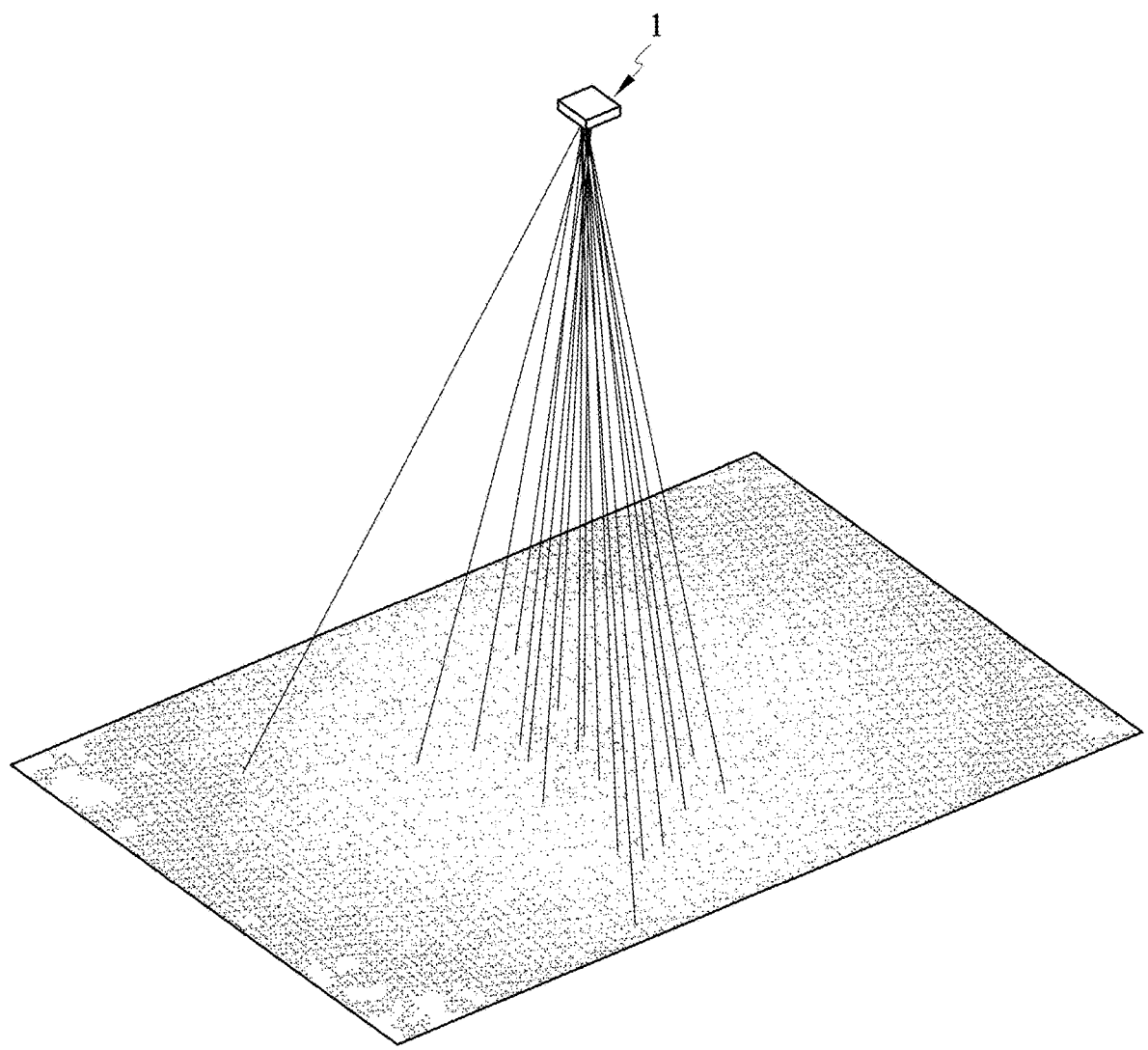
FIG. 6 is a light distribution diagram of bright and dark areas irradiated to a certain distance of the ultraviolet light array module in FIG. 1.
Figure 12:
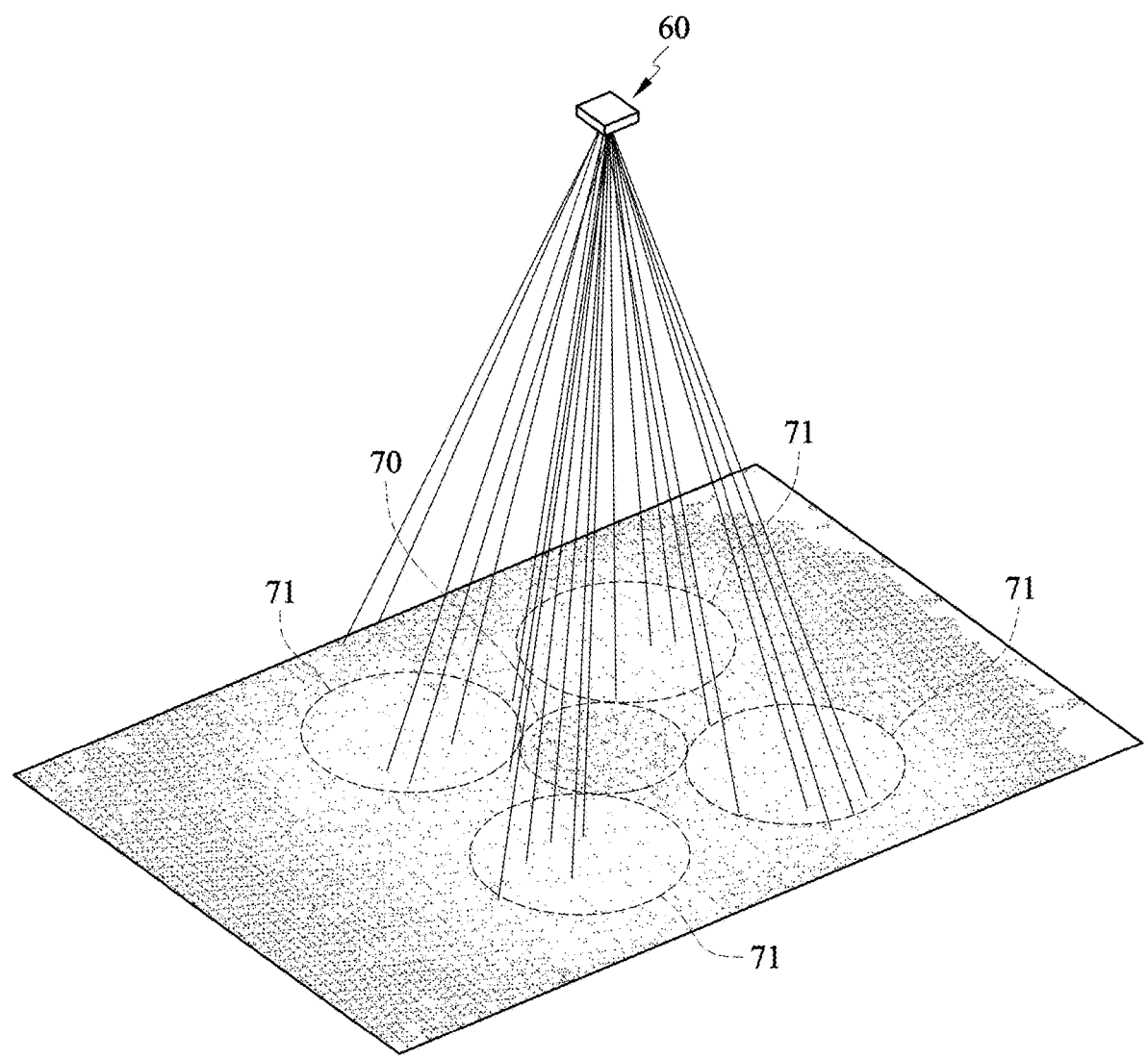
FIG. 12 is a light distribution diagram of bright and dark areas irradiated to a certain distance of the conventional ultraviolet light array module in FIG. 10A.

With further reference to FIG. 3, each light-concentrating protrusion 32 has an optical axis $X_L$ aligning with the light-emitting axis $X_{UV}$ of the corresponding UV chip 20. With further reference to FIG. 5, the ultraviolet light array module 1 as described presents a fairly uniform light shape within a certain light-emitting angle. In one embodiment, the amorphous silicon condensing plate 30 is mainly made of nano-scale particles of silicon dioxide and silane by a Sol-Gel process. The light-concentrating protrusions 32 that are in a liquid state during the process meet each other and are partially fused. After curing, the adjacent light-concentrating protrusions 32 are naturally integrated into a joint plane 322. Each joint plane 322 defines convex arc portions 321 of the adjacent light-concentrating protrusions 32. The radius of curvature of the convex arc portion 321 determines the emission angle of the ultraviolet light passing through the convex arc portion 321. Therefore, when each of the light-concentrating protrusions 32 retains enough area of the convex arc portion 321 to satisfy the specific light emission angle, the distance D between the optical axes $X_L$ of the adjacent light-concentrating protrusions 32 may be shortened as much as possible. Then, the ultraviolet light of the UV chips 20 is overlapped, and the central illuminance of the ultraviolet light array module 1 as described is increased. Therefore, as shown in FIG. 6, when the ultraviolet light array module 1 is irradiated to a certain distance, the ultraviolet light array module 1 does not have a distinct dark area (compared to that shown in FIG. 12), which means that the central illuminance is improved.

Figure 10A:
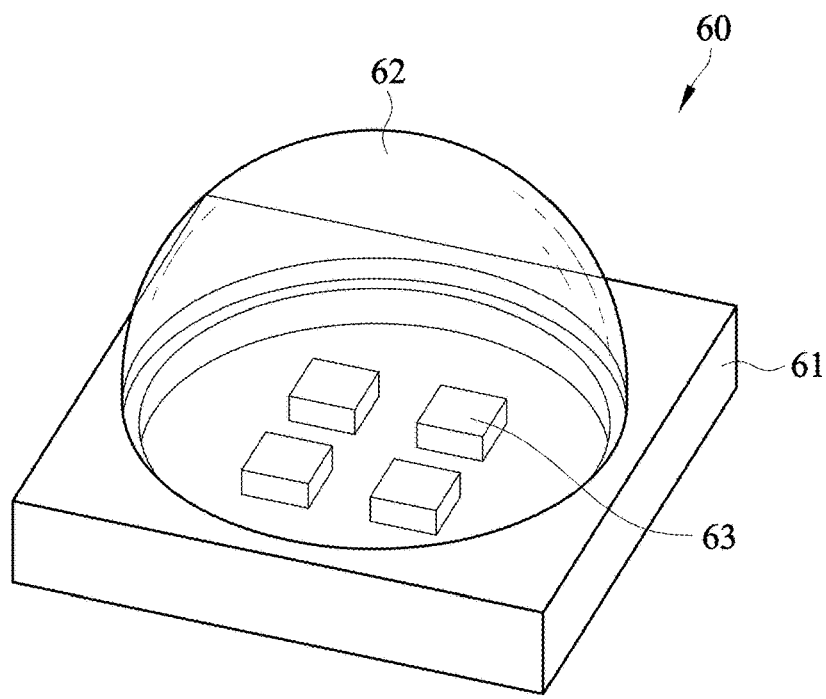
FIG. 10A is a perspective view of another conventional ultraviolet light array module in accordance with the prior art.
Figure 10B:
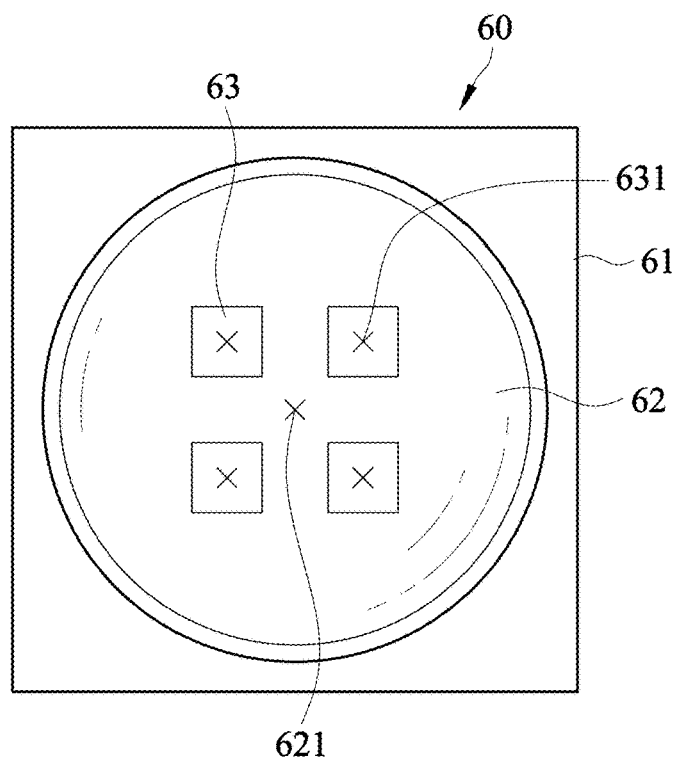
FIG. 10B is a top view of the conventional ultraviolet light array module in FIG. 10A.
Figure 11:
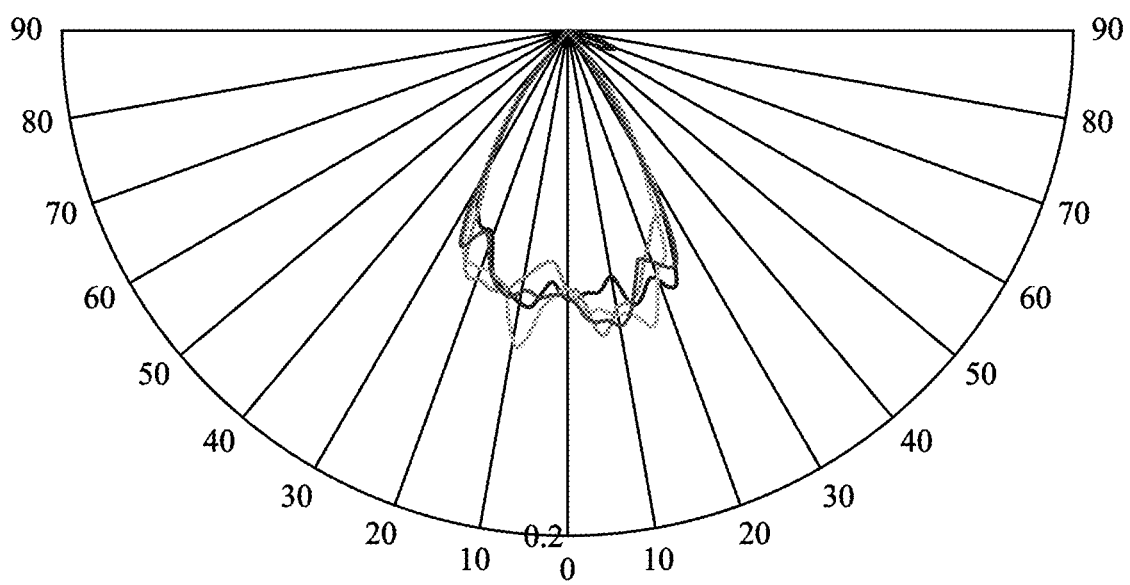
FIG. 11 is a light shape diagram of the conventional ultraviolet light array module in FIG. 10A.

Using the conventional ultraviolet light array module 60 shown in FIG. 10A and the ultraviolet light array module 1 as described shown in FIG. 1, which both use a 3.5 mm² substrate and the UV chips arranged in a 2*2 matrix, the central illuminances are tested after being irradiated to the same distance. Compared with the conventional ultraviolet light array module 60, the ultraviolet light array module 1 as described increases the central illuminance more than ten times.

Figure 7:
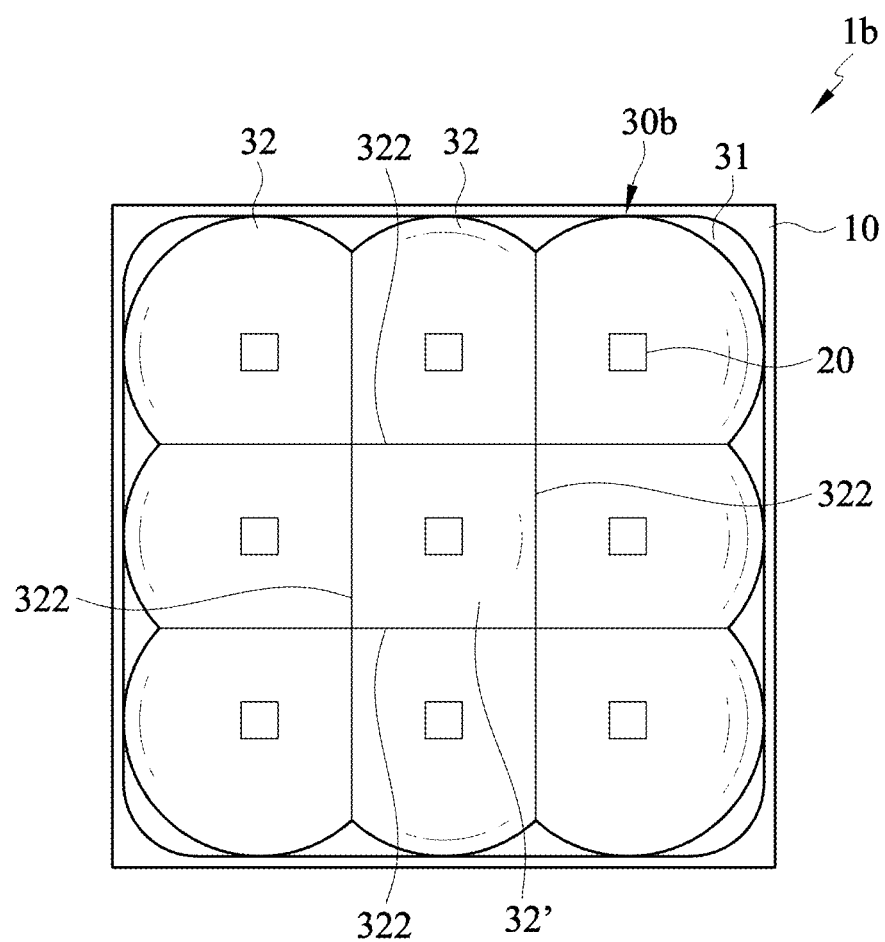
FIG. 7 is a top view of a third embodiment of an ultraviolet light array module in accordance with the present invention.
Figure 8:
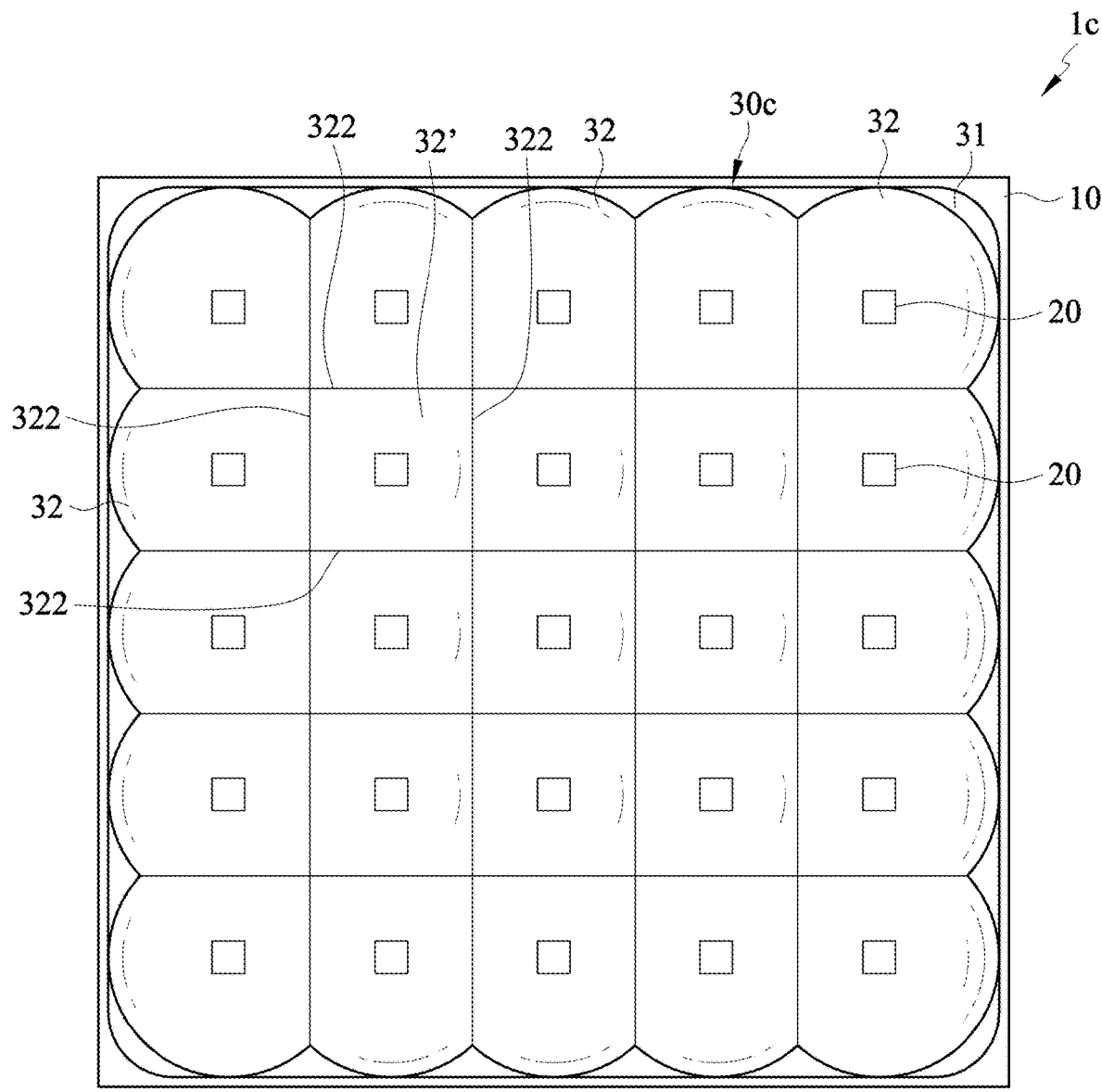
FIG. 8 is a top view of a fourth embodiment of an ultraviolet light array module in accordance with the present invention.
Figure 9A:
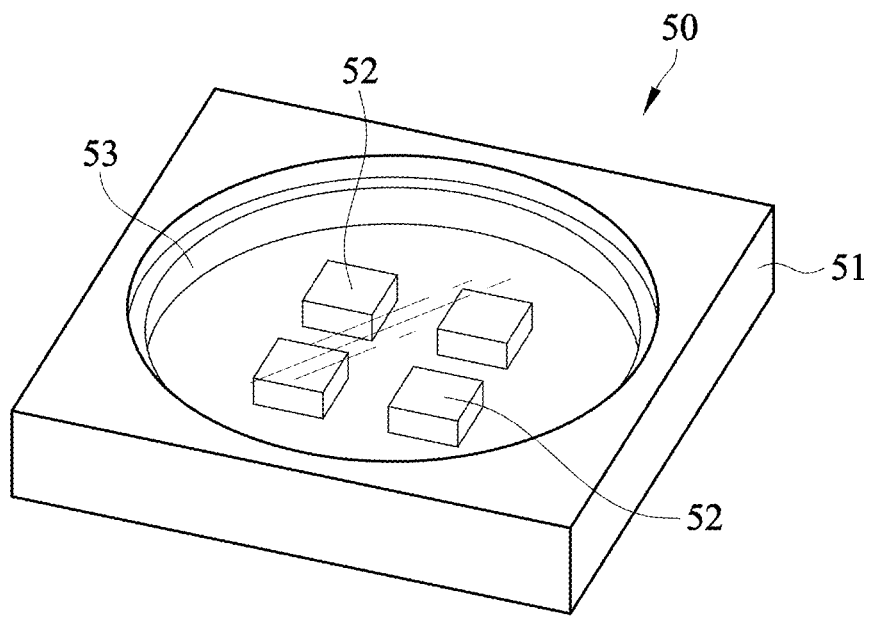
FIG. 9A is a perspective view of a conventional ultraviolet light array module in accordance with the prior art.
Figure 9B:
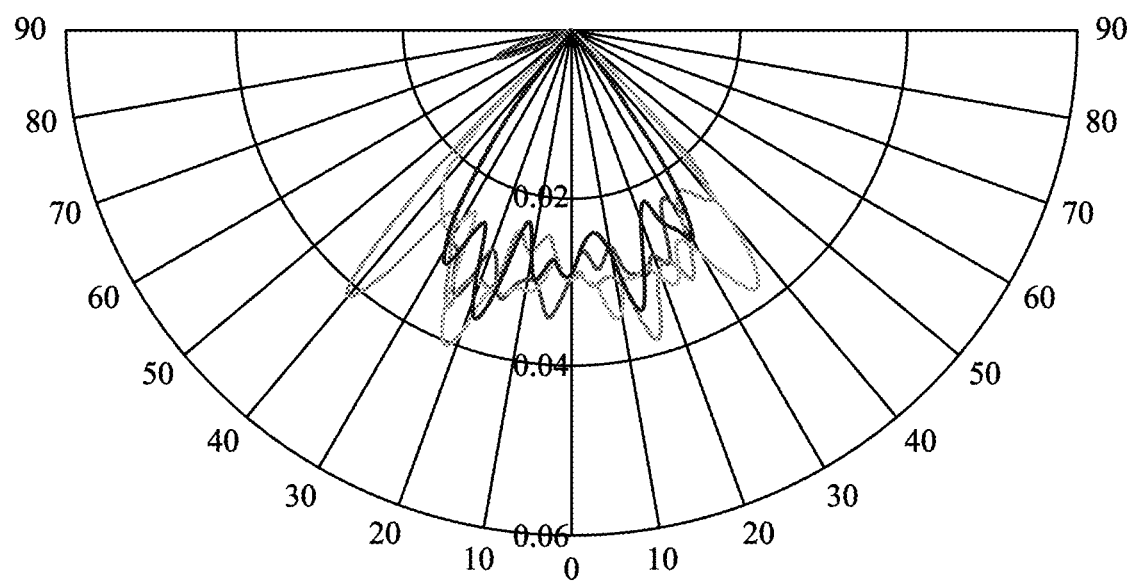
FIG. 9B is a light shape diagram of the conventional ultraviolet light array module in FIG. 9A.

Also using the conventional ultraviolet light array module 60 shown in FIG. 10A and the ultraviolet light array module 1 as described shown in FIG. 1 as the examples, which both use a 3.5 mm² substrate and the UV chips arranged in a 2*2 matrix. When the ultraviolet light array module 1 as described and the conventional ultraviolet light array module 60 emit the ultraviolet lights with the same emission angles, the ultraviolet light array module 1 as described uses a thinner amorphous silicon concentrator 30 to achieve the emission angle. This is because the optical axis 621 of the single quartz lens of the conventional ultraviolet light array module 60 is off-axis with the light-emitting axes 631 of the UV chips 63 below it, and the optical axis $X_L$ of each of the light-concentrating protrusions 32 of the ultraviolet light array module 1 as described is aligned with the light-emitting axis $X_{UV}$ of the corresponding UV chip 20. Therefore, each light-concentrating protrusion 32 of the ultraviolet light array module 1 as described needs about half the thickness of the single quartz lens 62 of the conventional ultraviolet light array module 60; therefore, the ultraviolet light array module 1 as described may have a thinner structure. With reference to FIG. 7, a third embodiment of an ultraviolet light array module 1b in accordance with the present invention also comprises a substrate 10, multiple UV chips 20, and an amorphous silicon concentrator 30b. In the third embodiment, the UV chips 20 are arranged in a 3*3 matrix. The amorphous silicon concentrator 30b has corresponding light-concentrating protrusions 32 formed in a 3*3 matrix. The light-concentrating protrusion 32' located at the center is adjacent to four of the light-concentrating protrusions 32 so that the light-concentrating protrusion 32' located at the center has four joint planes 322. With reference to FIG. 8, a fourth embodiment of an ultraviolet light array module 1c in accordance with the present invention also comprises a substrate 10, multiple UV chips 20, and an amorphous silicon concentrator 30c. In the fourth embodiment, the UV chips 20 are arranged in a 5*5 matrix. The amorphous silicon concentrator 30c has corresponding light-concentrating protrusions 32 formed in a 5*5 matrix. The light-concentrating protrusion 32' located at the center is adjacent to four of the light-concentrating protrusions 32 so that the light-concentrating protrusion 32' located at the center has four joint planes 322.

With reference to FIGS. 1, 3, 7 and 8, the light-concentrating protrusions 32 of the amorphous silicon concentrators 30, 30b, 30c are arranged in a matrix. Therefore, the arc surface of the convex arc portion 321 of each light-concentrating protrusion 32 in the outermost circle extends downward to the light-transmitting base 31 where the light-concentrating protrusions 32 are not formed.

In conclusion, the ultraviolet light array module 1 as described mainly replaces the single lens of the conventional ultraviolet light array module with the amorphous silicon concentrator 30. Since the light-concentrating protrusions 32 of the amorphous silicon dioxide concentrator 30 are integrally formed on the light-transmitting base 31, and the optical axis of each light-concentrating protrusion 32 is aligned with the light-emitting axis of the corresponding UV chip 20, the ultraviolet light array module 1 as described generates UV light with a specific luminous angle and uniform light shape. Compared with the conventional ultraviolet light array module using multiple independent lens, the ultraviolet light array module 1 as described has the light-concentrating protrusions 32 integrally formed on the light-transmitting base 31. Thus, the optical axes of the light-concentrating protrusions 32 are closer to each other. Then in the same irradiated distance, the emitted ultraviolet lights are overlapped with similar emitting angles to greatly increase the central illuminance and to maintain a uniform light shape. Moreover, since the amorphous silicon dioxide concentrator 30 may be made by the Sol-Gel process, the concentrating convex portions 321 with arc surface is formed together with the bonding and forming of the amorphous silicon dioxide. Thus, the light-concentrating protrusions 32 are not ground from a quartz block, which is helpful for mass production and reduces cost.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An ultraviolet light array module comprising:
   a substrate having a concave formed on a top surface of the substrate;
   multiple ultraviolet light (UV) chips arranged in a matrix in the concave of the substrate; and
   an amorphous silicon concentrator disposed on the substrate, covering the concave, and including
   a light-transmitting base covering the concave of the substrate and is kept a distance with the UV chips; and
   multiple light-concentrating protrusions continuously formed integrally on the light-transmitting base in a matrix, and each light-concentrating protrusion corresponding to one of the UV chips and having an optical axis aligning with an emitting axis of the corresponding UV chip, wherein each ultraviolet light passing through the light-concentrating protrusions has a specific emitting angle and the ultraviolet lights passing through the light-concentrating protrusions overlapping to each other.

2. The ultraviolet light array module as claimed in claim 1, wherein the light-concentrating protrusions connect to each other, and each light-concentrating protrusion has a convex arc portion for the ultraviolet light of the corresponding ultraviolet light chip to pass through to generate the specific emitting angle; and each two adjacent light-concentrating protrusions have a joint plane formed between.

3. The ultraviolet light array module as claimed in claim 1, wherein the UV chips and the light-concentrating protrusions are arranged in an n*m matrix, and n is equal to m.

4. The ultraviolet light array module as claimed in claim 1, wherein the UV chips and the light-concentrating protrusions are arranged in an n*m matrix, and n is larger than or is smaller than m.

5. The ultraviolet light array module as claimed in claim 2, wherein an arc surface of the convex arc portion of each light-concentrating protrusion in the outermost circle extends downward to the light-transmitting base where the light-concentrating protrusions are not formed.

6. The ultraviolet light array module as claimed in claim 1, wherein the amorphous silicon concentrator is made of nano-scale particles of silicon dioxide and silane by a Sol-Gel process.

7. The ultraviolet light array module as claimed in claim 2, wherein the amorphous silicon concentrator is made of nano-scale particles of silicon dioxide and silane by a Sol-Gel process.

8. The ultraviolet light array module as claimed in claim 5, wherein the amorphous silicon concentrator is made of nano-scale particles of silicon dioxide and silane by a Sol-Gel process.

9. The ultraviolet light array module as claimed in claim 1, wherein the UV chips have an emission wavelength between 200 nm to 280 nm.

10. The ultraviolet light array module as claimed in claim 2, wherein the UV chips have an emission wavelength between 200 nm to 280 nm.

11. The ultraviolet light array module as claimed in claim 8, wherein the UV chips have an emission wavelength between 200 nm to 280 nm.

12. The ultraviolet light array module as claimed in claim 9, wherein the emission wavelength is 254 nm±5 nm, 260 nm±5 nm to 265 nm±5 nm, or 270 nm±5 nm.

13. The ultraviolet light array module as claimed in claim 10, wherein the emission wavelength is 254 nm±5 nm, 260 nm±5 nm to 265 nm±5 nm, or 270 nm±5 nm.

14. The ultraviolet light array module as claimed in claim 11, wherein the emission wavelength is 254 nm±5 nm, 260 nm±5 nm to 265 nm±5 nm, or 270 nm±5 nm.

15. The ultraviolet light array module as claimed in claim 1, wherein a bottom surface of the light-transmitting base is larger than an opening of the concave of the substrate so that the light-transmitting base is disposed on the top surface of the substrate to cover the concave.

16. The ultraviolet light array module as claimed in claim 2, wherein a bottom surface of the light-transmitting base is larger than an opening of the concave of the substrate so that the light-transmitting base is disposed on the top surface of the substrate to cover the concave.

17. The ultraviolet light array module as claimed in claim 8, wherein a bottom surface of the light-transmitting base is larger than an opening of the concave of the substrate so that the light-transmitting base is disposed on the top surface of the substrate to cover the concave.

18. The ultraviolet light array module as claimed in claim 1, wherein the substrate has a stepped portion formed on a periphery of the top surface of the substrate so that the light-transmitting base is embedded in the stepped portion of the substrate to cover the concave.

19. The ultraviolet light array module as claimed in claim 2, wherein the substrate has a stepped portion formed on a periphery of the top surface of the substrate so that the light-transmitting base is embedded in the stepped portion of the substrate to cover the concave.

20. The ultraviolet light array module as claimed in claim 8, wherein the substrate has a stepped portion formed on a periphery of the top surface of the substrate so that the light-transmitting base is embedded in the stepped portion of the substrate to cover the concave.

* * * * *